(12) United States Patent
Wang et al.

(10) Patent No.: US 11,460,603 B1
(45) Date of Patent: Oct. 4, 2022

(54) METHOD FOR COMPUTING FACTOR OF SAFETY OF A SLOPE

(71) Applicants: Chengdu University of Technology, Sichuan (CN); Shanghai Dianji University, Shanghai (CN); State Grid Sichuan Electric Power Research Institute, Sichuan (CN)

(72) Inventors: Wei Wang, Sichuan (CN); Denwood Vaughan Griffiths, Golden, CO (US); WangZhifu Yang, Shanghai (CN); Xianghang Bu, Sichuan (CN)

(73) Assignees: Chengdu University of Technology, Sichuan (CN); Shanghai Dianji University, Shanghai (CN); State Grid Sichuan Electric Power Research Institute, Sichuan (CN)

( * ) Notice: Subject to any disclaimer, the term of this patent is extended or adjusted under 35 U.S.C. 154(b) by 0 days.

(21) Appl. No.: 17/334,804

(22) Filed: May 31, 2021

(30) Foreign Application Priority Data

Apr. 27, 2021 (CN) .......................... 202110462017.9

(51) Int. Cl.
*G01V 99/00* (2009.01)
*G06F 30/23* (2020.01)

(52) U.S. Cl.
CPC .............. *G01V 99/00* (2013.01); *G06F 30/23* (2020.01)

(58) Field of Classification Search
None
See application file for complete search history.

(56) References Cited

U.S. PATENT DOCUMENTS

| 6,607,332 B2* | 8/2003 | Kang | .................... E02D 17/207 405/19 |
| 2019/0368150 A1* | 12/2019 | Kasahara | ............... G01N 33/24 |

FOREIGN PATENT DOCUMENTS

| CN | 105804099 A | * | 7/2016 |
| CN | 111814369 A | * | 10/2020 |
| CN | 111931272 A | * | 11/2020 |
| CN | 112115530 A | * | 12/2020 |
| CN | 112488455 A | * | 3/2021 |

OTHER PUBLICATIONS

J. Michael Duncan et al., "Soil Strength and Slope Stability," John Wiley & Sons, Inc., Jan. 2005, pp. 1-307.

(Continued)

*Primary Examiner* — Lina M Cordero
(74) *Attorney, Agent, or Firm* — JCIP Global Inc.

(57) ABSTRACT

The present application relates to method for computing the factor of safety of a slope including the following steps. Step 1: input parameters of a slope. Step 2: formulae a formula of stability number N into a target function and determine constrained conditions of geometric parameters α and λ. Step 3: obtain a minimum stability number N. Step 4: determine a position of a critical slip surface. Step 5: transform the critical slip surface defined by α, λ and n into a critical slip surface defined by R, $x_c$ and $y_c$, and compute overturning moments of slid masses above and below external water level of the critical slip surface. Step 6: resolve an equivalent unit weight. Step 7: resolve the factor of safety FS.

14 Claims, 13 Drawing Sheets

(56) References Cited

OTHER PUBLICATIONS

J. M. Duncan et al., "An Engineering Manual for Slope Stability Studies," Virginia Tech Center for Geotechnical Practice and Research, Mar. 1987, pp. 1-85.
R. E. Gibson et al., "A Note on the Stability of Cuttings in Normally Consolidated Clays," Geotechnique, vol. 12, Sep. 1962, pp. 212-216.
J. H. Hunter et al., "Stability of Simple Cuttings in Normally Consolidated Clays," Geotechnique, vol. 18, Sep. 1968, pp. 372-378.
Donald W. Taylor, "Stability of earth slopes," Journal of the Boston Society of Civil Engineers, Jul. 1937, pp. 337-386.
A. Keith Turner et al., "Landslides: Investigation and Mitigation," Transportation Research Board, Jun. 1996, pp. 1-686.
US Army Corps of Engineers, "Engineering and Design: Slope Stability (Engineer Manual 1110-2-1902)," available at: http://www.usace.army.mil/inet/usace-docs/, Oct. 2003, pp. 1-205.

\* cited by examiner

METHOD FOR COMPUTING FACTOR OF SAFETY OF A SLOPE

CROSS-REFERENCE TO RELATED APPLICATION

This application claims a priority to Chinese Patent Application serial no. 202110462017.9, filed on Apr. 27, 2021. The entirety of the above-mentioned patent application is hereby incorporated by reference herein and made a part of this specification.

FIELD OF THE INVENTION

The present application relates to the field of slope engineering, and in particular, to a method for computing a factor of safety of a slope, especially a partially submerged undrained slope with strength linearly increasing and unlimited foundation depth.

DESCRIPTION OF RELATED ART

A slope chart is one of the methods for stability analysis, which provides an approach for rapidly analyzing the stability of a slope. It can be used for preliminary analysis and detailed analysis of checking, since it can provide an extremely fast result, especially being useful for selecting design schemes.

Taylor (1937) firstly developed a simple stability chart for evaluating the safety factor of homogeneous soil slopes based on a friction circle method. Such method attracted the attention of many scholars who correspondingly proposed a wide variety of stability charts for analyzing 2-dimentional slope stability, so that they were widely used in engineering practice.

Gibson & Morgenstern (1962) firstly proposed a stability chart on the stability of slope cut into normally consolidated and undrained clay where the strength increases linearly with depth. In particular, they established a relationship between factor of safety and slope inclination for the case where the shear strength is zero at the ground surface and increase linearly with depth, which means that the ground water table is at or above the ground surface. Hunter & Schuster (1968) extended the analytical solution of Gibson & Morgenstern (1962) to the case of ground water table below the ground surface. For this common case, according to the consolidation theory of clay, the shear strength $s_{u0}$ at this time is greater than zero at the ground surface but still increases linearly with depth. By focusing on the theoretical research on the stability of slope cut into normally consolidated and undrained clay, Hunter & Schuster established an idealized strength-depth relationship associated with a specific water lever h in the slope.

Neither of the above studies involves in the situation where water is present outside a slope. In actual practice, the stability chart provided by Hunter and Schuster (1968) for a undrained slope where the strength increases linearly with depth was further extended into the stability analysis of a slope with an external water level. However, such stability chart was established merely based on a slope with homogeneous unit weight, so that they can be used in two situations, that is, a submerged slope and a slope without external water surface, but can not be directly applicable to a situation where a slope is partially submerged.

Although stability analysis of an undrained slope, with or without an external water table, strictly involves total stresses, it has been noted that the partially submerged undrained slope has the same factor of safety as a 2-layer soil slope, where the external water level has been removed, and the soil in the slope above and beneath the original location of the outside water surface is set to its saturated and buoyant unit weight, respectively.

Slope stability charts for layered soils typically require simplified properties, so strategies have been proposed for determining average strength and unit weight that could be used as an equivalent "homogenized" property with charts. For example, for undrained clay slopes, it is usually considered sufficient to use a simple weighted average of the unit weight based on the thickness of each layer down to the toe.

Using this approach for the 2-layer system, the average unit weight was not associated with a critical slip surface determined by a minimum stability number N while averaging the unit weight, a constant overturning moment is not guaranteed, and the influence of a slope angle is not considered in these means. Instead, a constant average unit weight is obtained at a certain water level against different slope angles, which, however, will results in a large error to the obtained average unit weight, and even pass the error to the factor of safety. Further, the obtained factor of safety will be overestimated, and stability evaluation will probably be incorrect.

Therefore, there is still a need for a method capable of accurately evaluating the safety performance of a slope, especially a partially submerged slope.

BRIEF SUMMARY OF THE INVENTION

In view of above problem, the present application provides a method for computing the factor of safety of a slope, especially a partially submerged undrained slope, with a high accuracy.

In some embodiments, a method for computing the factor of safety of a slope includes the following steps.

Step 1: acquiring parameters of the slope including unit weights of soil, slope geometry, soil strength and external water level;

Step 2: formulating a formula of stability number N into a target function and determining constrained conditions of variable geometric parameters in the target function;

Step 3: retrieving a combination of the variable geometric parameters $\alpha$ and $\lambda$ by calling a genetic algorithm library through a Python program to obtain a minimum stability number N;

Step 4: determining a position of a critical slip surface according to the retrieved combination of the variable geometric parameters and the slope geometry acquired in Step 1;

Step 5: transforming the determined critical slip surface into a critical slip surface defined by a circular arc radius R of the critical slip surface and horizontal and vertical coordinate values $x_c$ and $y_c$ of a circle center of the critical slip surface, and computing overturning moments of slid masses above and below external water level of the critical slip surface;

Step 6: resolving an equivalent unit weight $\gamma_{equiv}$ according to overturning moment equilibrium; and Step 7: resolving the factor of safety from the obtained minimum stability number N, a gradient $\rho$ of soil strength and the equivalent unit weight obtained in Step 6 according to the following formula (1):

$$FS = N\frac{\rho}{\gamma}, \qquad (1)$$

where $\gamma$ is equal to the equivalent unit weight $\gamma_{equiv}$.

In some other embodiments, a method for computing the factor of safety of a slope includes the following steps.

Step 1: acquiring parameters of the slope including saturated unit weight of soil ($\gamma_{sat}$) and unit weight of water ($\gamma_w$), slope geometry ($\beta$, H), soil strength ($s_{u0}$, $\rho$, M) and external water level ($d_w/H$);

Step 2: formulating a formula of stability number N into a target function and determining constrained conditions of geometric parameters $\alpha$ and $\lambda$;

Step 3: retrieving a combination of geometric parameters $\alpha$ and $\lambda$ by calling a genetic algorithm library through a Python program to obtain a minimum stability number N;

Step 4: determining a position of a critical slip surface according to the obtained geometric parameters $\alpha$, $\lambda$ and dimensionless value n;

Step 5: transforming the critical slip surface defined by $\alpha$, $\lambda$ and n into a critical slip surface defined by a circular arc radius R of the critical slip surface and horizontal and vertical coordinate values $x_c$ and $y_c$ of a circle center of the critical slip surface, and computing overturning moments of slid masses above and below external water level of the critical slip surface;

Step 6: resolving an equivalent unit weight according to overturning moment equilibrium; and Step 7: resolving the factor of safety from the obtained minimum stability number N, a gradient $\rho$ of soil strength and the equivalent unit weight obtained in Step 6 according to the following formula (1):

$$FS = N \frac{\rho}{\gamma},\qquad(1)$$

In some embodiments, in Step 1, the unit weights include the saturated unit weight ($\gamma_{sat}$) of the soil and the unit weight ($\gamma_w$) of water while assigning the unit weight of soil above and below the external water level, saturated and buoyant unit weight, respectively. $\beta$ represents a slope angle of the slope, and H represents a height of the slope. The undrained strength of soil is given by the equation:

$$s_u(z) = s_{u0} + \rho z \qquad(2)$$

where $s_{u0}$ is the strength at crest level (z=0) and $\rho$ is the gradient of strength linearly increasing with depth z. The external water level parameter can be defined as $d_w/H$ where $d_w$ denotes a depth of water level outside the slope from the top of the slope.

In some embodiments, in Step 2, the target function for a circular arc failure mechanism can be expressed as:

$$N = \frac{3}{\sin^2 \alpha \sin^2 \lambda} \frac{[\cot \lambda + \alpha(1 \to 2M - \cot \alpha \cot \lambda)]}{(1 - 2 \cot^2 \beta + 3 \cot \lambda \cot \beta + 3 \cot \alpha \cot \lambda - 3 \cot \alpha \cot \beta)} \qquad(3)$$

where $\alpha$ denotes half of a central angle of a circular arc slip surface, $\lambda$ denotes an angle between a chord line of a circular arc slip surface and the horizontal plane, $\beta$ denotes an angle of the slope, and M denotes a dimensionless strength gradient parameter. In some embodiments, M can be defined as:

$$M = \frac{h}{H}\frac{\gamma_w}{\gamma} \qquad(4)$$

where h denotes a specific water level in the slope, $\gamma_w$ denotes a unit weight of water, and $\gamma'$ denotes a buoyant unit weight of soil. In practice, h can be neglected and thus M can be simplified as:

$$M = \frac{H_o}{H} = \frac{s_{u0}}{\rho H} \qquad(5)$$

where $H_0$ denotes an intercept of a strength line.

In some other embodiments, in Step 2, the variable geometric parameters include $\alpha$ and $\lambda$, and the constrained conditions of variable geometric parameters $\alpha$ and $\lambda$ can be, for example, $\alpha$: [0, 90°] and $\lambda$: [0, $\beta$].

In some embodiments, in Step 4, the position of the critical slip surface can be defined by $$n = \frac{1}{2}(\cot\lambda - \cot\alpha - \cot\beta). \qquad(6)$$

where the dimensionless value n denotes a measure of the distance the critical slip surface outcrops beyond the toe of the slope; and, if n is zero or negative, the critical circles pass through the toe, as shown in FIG. 5B or FIG. 5C, and if n is positive, a critical circle exists below the toe, as shown in FIG. 5A.

In some embodiments, in Step 5, for a deep toe circle or a shallow toe circle, transforming the determined critical slip surface into a critical slip surface defined by R, $x_c$ and $y_c$ is performed by $$R = \frac{H}{2 \sin \alpha \sin \lambda} \qquad(7)$$

$$x_c = \frac{H}{\tan \beta} - R \sin(\alpha - \lambda) \text{ and} \qquad(7\text{-}1)$$

$$y_c = R \cos*(\alpha - \lambda) - H. \qquad(7\text{-}2)$$

In some other embodiments, in Step 5, for a deep circle, transforming the determined critical slip surface into a critical slip surface defined by R, $x_c$ and $y_c$ is performed by $$R = \frac{H}{2 \sin \alpha \sin \lambda} \qquad(7)$$

$$x_c = \frac{H}{\tan \beta} - [R \sin(\alpha - \lambda) - nH] \text{ and} \qquad(7\text{-}3)$$

$$y_c = R \cos*(\alpha - \lambda) - H. \qquad(7\text{-}4)$$

In some embodiments, in Step 6, the overturning moment equilibrium is expressed as:

$$M_1 + M_2 = M_0 \qquad(8)$$

where $M_0$ denotes the total moment of a whole slip mass having an equivalent unit weight, $M_1$ denotes an overturning moment of saturated unit weight of slip mass above the external water level, and $M_2$ denotes an overturning moment of buoyant unit weight of slip mass between the external water level and the toe of the slope.

In a further embodiment, $$M_1 = \gamma_{sat} \int_{-d_w}^{0} (x_C - x_G) dA \qquad(9)$$

where $\gamma_{sat}$ denotes saturated unit weight of soil, $x_G$ denotes the horizontal coordinate value of the centroid of a thin horizontal integral element of soil at a general depth y, $d_w$ denotes the depth of water outside slope measured below the crest, and dA denotes the integral element area.

In a further embodiment, $$M_2 = \gamma' \int_{y_T}^{-d_w} (x_C - x_G) dA \qquad (10)$$

where $\gamma'$ denotes buoyant unit weight of soil, and $y_T$ denotes a vertical coordinate of the toe of the slope.

In a preferred embodiment, $$M_0 = \gamma_{equiv} \int_{y_T}^{0} (x_C - x_G) dA \qquad (11).$$

In some embodiments, $M_0$ can be further expressed as:

$$M_0 = \frac{\gamma H^3}{12} [1 - 2 \cot^2 \beta + \qquad (12)$$
$$3 \cot \lambda \cot \beta + 3 \cot \alpha \cot \lambda - 3 \cot \alpha \cot \beta].$$

Then, the moment equilibrium can be further expressed as:

$$M_0 = M_1 + M_2 = \gamma_{equiv} \int_{y_T}^{0} (x_C - x_G) dA \qquad (13)$$
$$= \frac{\gamma H^3}{12} [1 - 2 \cot^2 \beta + 3 \cot \lambda \cot \beta +$$
$$3 \cot \alpha \cot \lambda - 3 \cot \alpha \cot \beta].$$

which reflects the equivalent relationship between the overturning moment of partially submerged undrained slope and that of a uniform slope without external water surface and having equivalent unit weight.

In some embodiments, in order to resolve the equations (9), (10) and (11), from a circular arc equation of a slip surface:

$$x = x_C - \sqrt{R^2 - (y - y_C)^2}, \text{ and} \qquad (14)$$

a slope equation:

$$x = -\frac{y}{\tan \beta} \qquad (15)$$

it gives $$x_G = \frac{1}{2} \left( x_C - \sqrt{R^2 - (y - x_C)^2} - \frac{y}{\tan \beta} \right) \qquad (16)$$

which further gives $$x_C - x_G = \frac{1}{2} \left[ \sqrt{R^2 - (y - y_C)^2} + \left( \frac{y}{\tan \beta} + x_C \right) \right] \qquad (17)$$

$$dA = \left[ \sqrt{R^2 - (y - y_C)^2} - \left( \frac{y}{\tan \beta} + x_C \right) \right] dy. \qquad (18)$$

Substituting equations (17) and (18) into equations (9)-(11) and then into equation (13) provides an equivalent unit weight:

$$\gamma_{equiv} = \frac{\gamma_{sat} \int_{-d_W}^{0} (x_C - x_G) dA + \gamma' \int_{y_T}^{-d_W} (x_C - x_G) dA}{\int_{y_T}^{0} (x_C - x_G) dA}. \qquad (19)$$

In some embodiments, the equivalent unit weight $\gamma_{equiv}$ can be obtained from an equivalent unit weight diagram represented by FIG. 14 and equation (22).

DETAILED DESCRIPTION

The analysis of equivalent unit weight of partially submerged undrained slope with unlimited foundation depth where the strength increases linearly with depth is essentially an analysis of slope stability. The accuracy of solving the factor of safety by using a slope stability chart is usually determined by the accuracy of the shear strength parameters as obtained. In addition, a slope failure or a land sliding is essentially a movement of rock-soil body down the slope under the action of gravity. Therefore, the unit weight of soil has a significant impact on the accuracy of the factor of safety FS.

Figure 1:
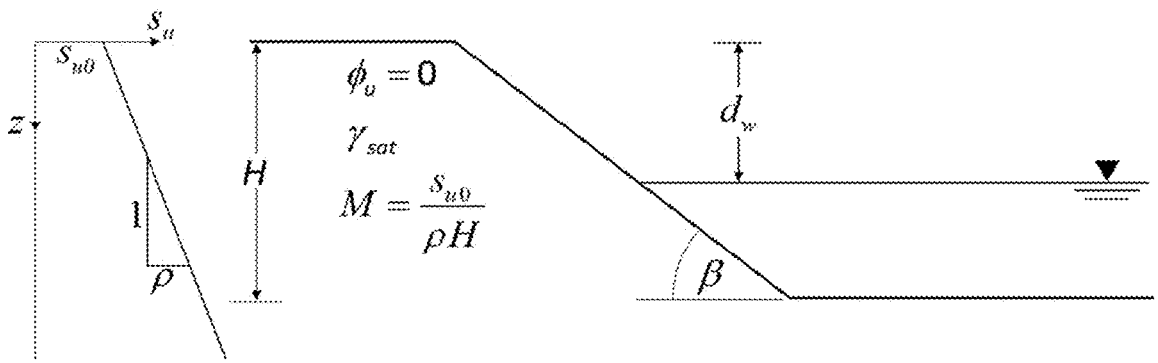
FIG. 1 is a schematic view of an undrained slope with linearly increasing strength and an external water surface.

The stability chart of an undrained slope where the strength increases linearly with depth was established regarding a simple slope having homogeneous unit weight, and thus can be directly applied to two cases, that is, a submerged case and a case without water outside the slope, but cannot be directly applied to a partially submerged undrained slope, as shown in FIG. 1.

Figure 2:
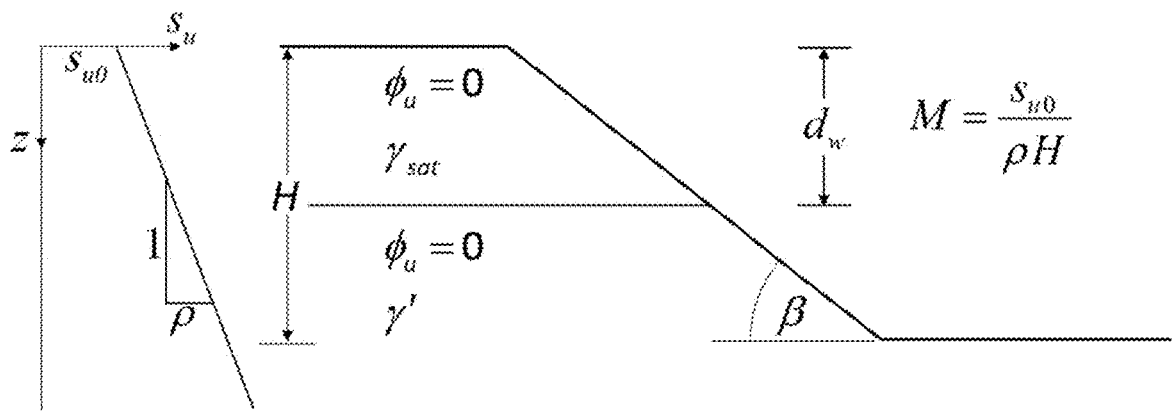
FIG. 2 is a schematic view of a slope equivalent to that in FIG. 1, with the water removed and the buoyant unit weight substituted below where the water surface was previously.

Although stability analysis of an undrained slope, with or without an external water table, strictly involves total stresses, it has been noted that the partially submerged undrained slope shown in FIG. 1 has the same factor of safety as a 2-layer soil slope shown in FIG. 2, where the water has been removed, and the soil in the slope above and beneath the original location of the outside water surface is set to its saturated and buoyant unit weight, respectively.

Figure 3:
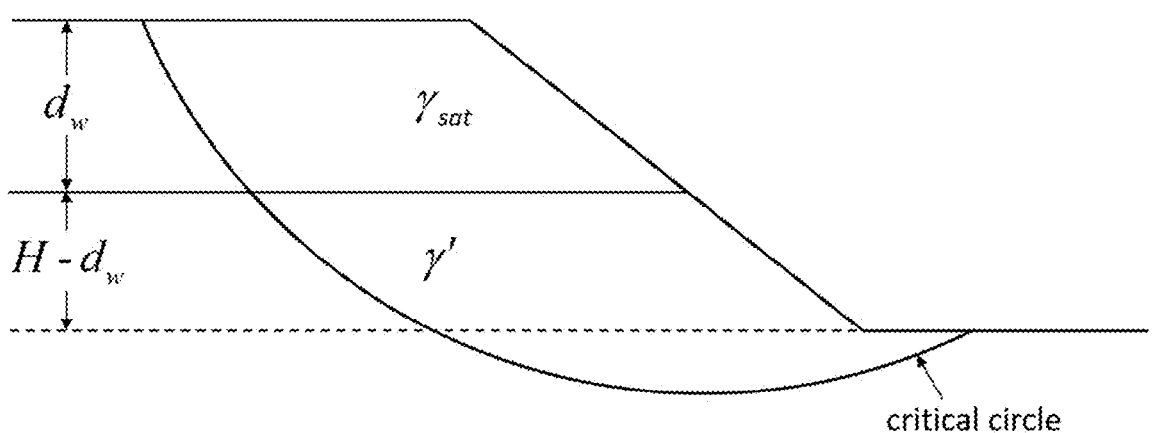
FIG. 3 is a schematic view of simple averaging of unit weights in a layered undrained soil.

Slope stability charts for layered soils typically require simplified properties, so strategies have been proposed for determining average strength and unit weight that could be used as an equivalent "homogenized" property with charts. For example, for undrained clay slopes, it is usually considered sufficient to use a simple weighted average of the unit weight based on the thickness of each layer down to the toe. Using this approach for the 2-layer system shown in FIG. 3, the average unit weight would be given by equation (20)

$$\gamma_{av} = \frac{d_w \gamma_{sat} + (H - d_w)\gamma'}{H} = \gamma_{sat} - \left(1 - \frac{d_w}{H}\right)\gamma_w \quad (20)$$

where $\gamma_{av}$ is the average unit weight, $\gamma_{sat}$ is the saturated unit weight of soil, $\gamma_w$ is the unit weight of water, $\gamma'$ is the buoyant unit weight of soil below the external water surface, H is the height of slope and $d_w$ is the depth of water outside slope measured below the crest.

Using this approach for the 2-layer system, the average unit weight was not associated with a critical slip surface determined by a minimum stability number N while averaging the unit weight, a constant overturning moment is not guaranteed, and the influence of a slope angle is not considered in these means. Instead, a constant average unit weight is obtained at a certain water level against different slope angles, which, however, will results in a large error to the obtained average unit weight, and even pass the error to the factor of safety. Further, the obtained factor of safety will be overestimated, and the result for stability evaluation will probably be incorrect.

Figure 4:
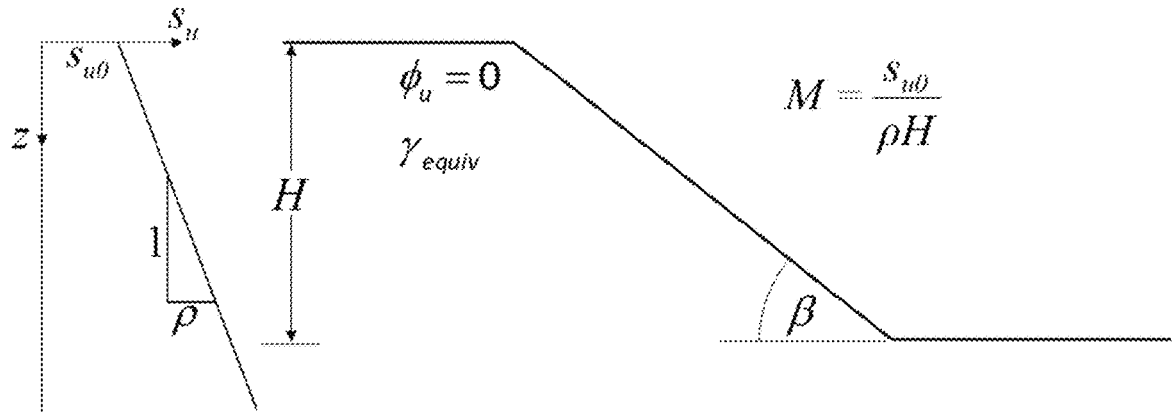
FIG. 4 is a schematic view of a slope equivalent to that in FIG. 1, with the water removed and an equivalent unit weight used throughout.

The goal of this present application, therefore, is to find the equivalent unit weight as shown in FIG. 4 that gives the same factor of safety as the slopes in FIGS. 1 and 2.

In the present application, a toe or deep critical circular failure mechanism is assumed, and a total stress analysis of single rigid body limit equilibrium analytical method satisfying moment balance is adopted. As a result, an optimal minimum stability number N and critical slip surface are successfully obtained based on the analytic solution of stability number N of Hunter & Schuster (1968) by using a self-developed genetic algorithm Python optimization program. The present application further proposed an analytic method of an equivalent unit weight based on the obtained critical slip surface.

The equivalent problems shown in FIGS. 2 and 4 have the same slope geometry and undrained strength profile and will be assumed to have the same critical failure surface and factor of safety. The critical failure surface may be determined by optimizing the minimum stability number N from Equation (3), which is a function of $\beta$ and M but not $\gamma$. Furthermore, the factor of safety in terms of moments is given by:

$$FS = \frac{M_R}{M_O} \quad (12\text{-}1)$$

where $M_R$ and $M_O$ are given as:

$$M_R = \frac{\rho R H^2}{2\sin\alpha\sin\lambda}[\cot\lambda + \alpha(1 + 2M - \cot\alpha\cot\lambda)] \quad (12\text{-}2)$$

$$M_O = \frac{\gamma H^3}{12}[1 - 2\cot^2\beta + 3\cot\lambda\cot\beta + 3\cot\alpha\cot\lambda - 3\cot\alpha\cot\beta]. \quad (12)$$

From equations (12-2) and (12), it can be noted that the overturning moment $M_O$, but not the resisting moment $M_R$, is dependent on $\gamma$. For a given critical failure surface, since $M_R$ is the same in both cases, it is obvious that as long as $M_O$ is the same, the factor of safety will also be unchanged.

In this method, the accuracy of the factor of safety is improved by ensuring the equivalent principle of a constant overturning moment $M_O$ when homogenizing the unit weight and taking the influence of the slope inclination $\beta$ on the unit weight into consideration. Therefore, a new set of equivalent unit weight chart suitable for a wide variety of water level $d_w/H$ conditions against different slope inclination $\beta$ which can be used in combination with a stability chart is proposed, which provides a new tool for convenient and accurate engineering applications.

Based on the above finding, the present application proposes a method for computing the factor of safety from equivalent unit weight for a slope, which includes the steps of optimizing stability number N and calculating equivalent unit weight. In some embodiments, a method for computing the factor of safety of a slope includes the following steps.

Step 1: acquiring parameters of the slope including saturated unit weight of soil ($\gamma_{sat}$) and unit weight of water ($\gamma_w$), slope geometry ($\beta$, H), soil strength ($s_{u0}$, $\rho$, M) and external water level ($d_w/H$);

Step 2: formulating a formula of stability number N into a target function and determining constrained conditions of variable geometric parameters $\alpha$ and $\lambda$ in the target function;

Step 3: retrieving a combination of geometric parameters $\alpha$ and $\lambda$ by calling a genetic algorithm library through a Python program to obtain a minimum stability number N;

Step 4: determining a position of a critical slip surface according to the retrieved combination of the variable geometric parameters α, λ and the slope geometry acquired in Step 1;

Step 5: transforming the determined critical slip surface into a critical slip surface defined by a circular arc radius R of the critical slip surface and horizontal and vertical coordinate values $x_c$ and $y_c$ of a circle center of the critical slip surface, and computing overturning moments of slid masses above and below external water level of the critical slip surface;

Step 6: resolving an equivalent unit weight $\gamma_{equiv}$ according to overturning moment equilibrium; and Step 7: resolving the factor of safety from the obtained minimum stability number N, a gradient ρ of soil strength and the equivalent unit weight $\gamma_{equiv}$ obtained in Step 6 according to the following formula (1):

$$FS = N\frac{\rho}{\gamma}. \tag{1}$$

Figure 5A:
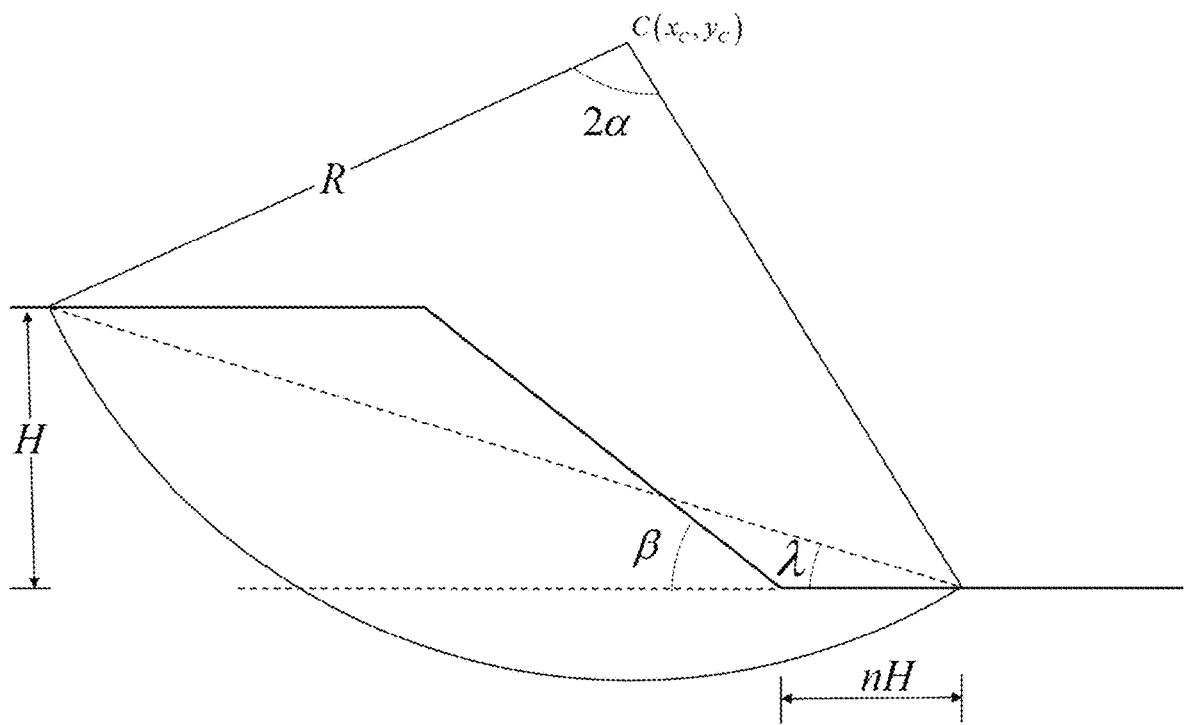
FIGS. 5A-5C are three types of circular arc failure mechanisms of a partially submerged undrained slope: deep circle in FIG. 5A, deep toe circle in FIG. 5B, and shallow toe circle in FIG. 5C.
Figure 5B:
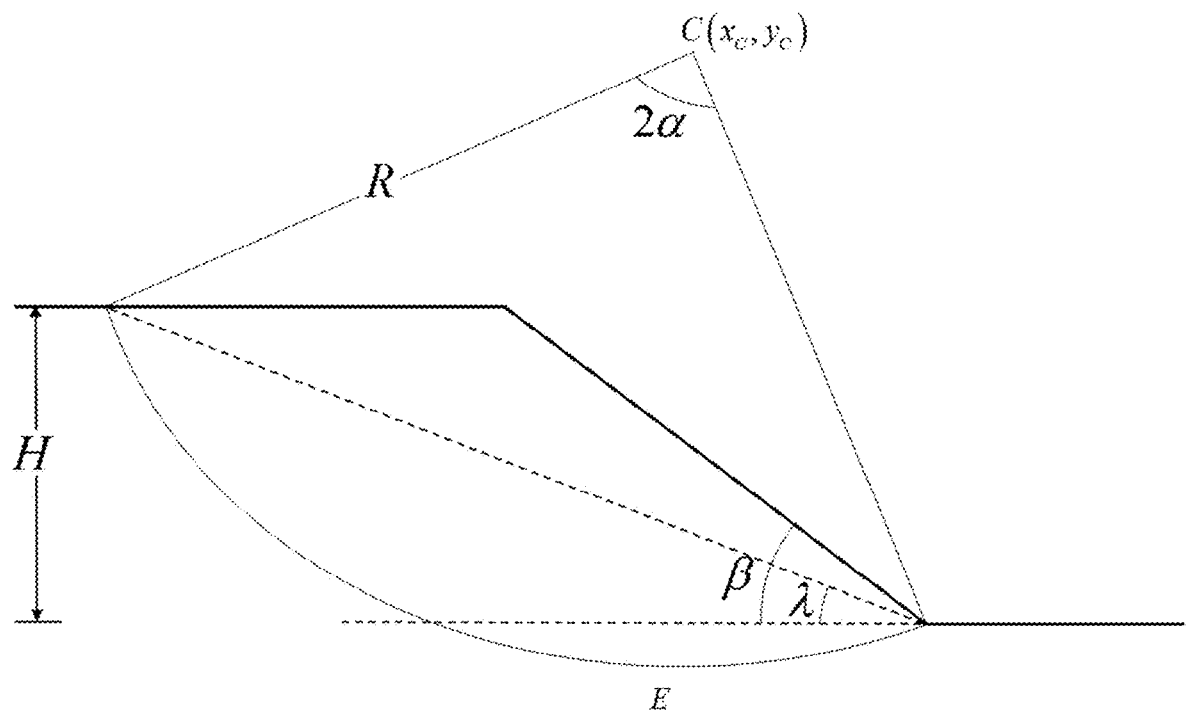
Figure 5C:
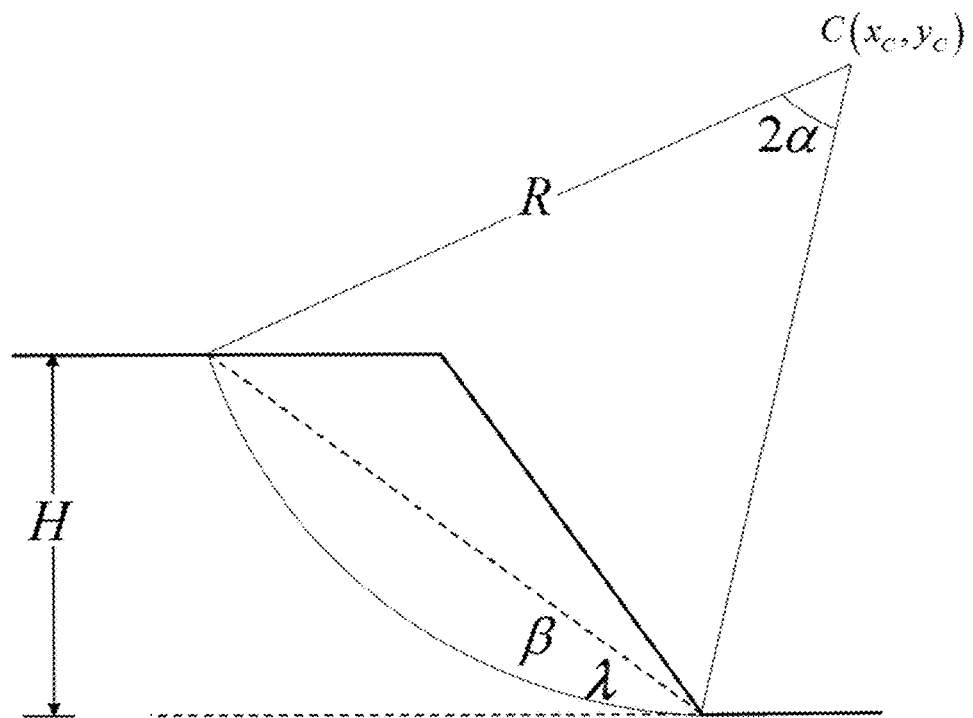

In some embodiments, after determining a minimum stability number N and a critical slip surface via an optimization program, the critical slip surface defined by α, λ and n is changed into that defined by R, $x_c$ and $y_c$. Based on three types of slope failure mechanisms and using an external water line and a horizontal line at the slope toe as interfaces, the deep circle shown in FIG. 5A and the deep toe circle shown in FIG. 5B for a slip surface passing below the toe of the slope are divided into three sections, and the shallow toe circle for a slip surface without passing below the toe of the slope as shown in FIG. 5C is divided into to two sections.

Figure 6A:
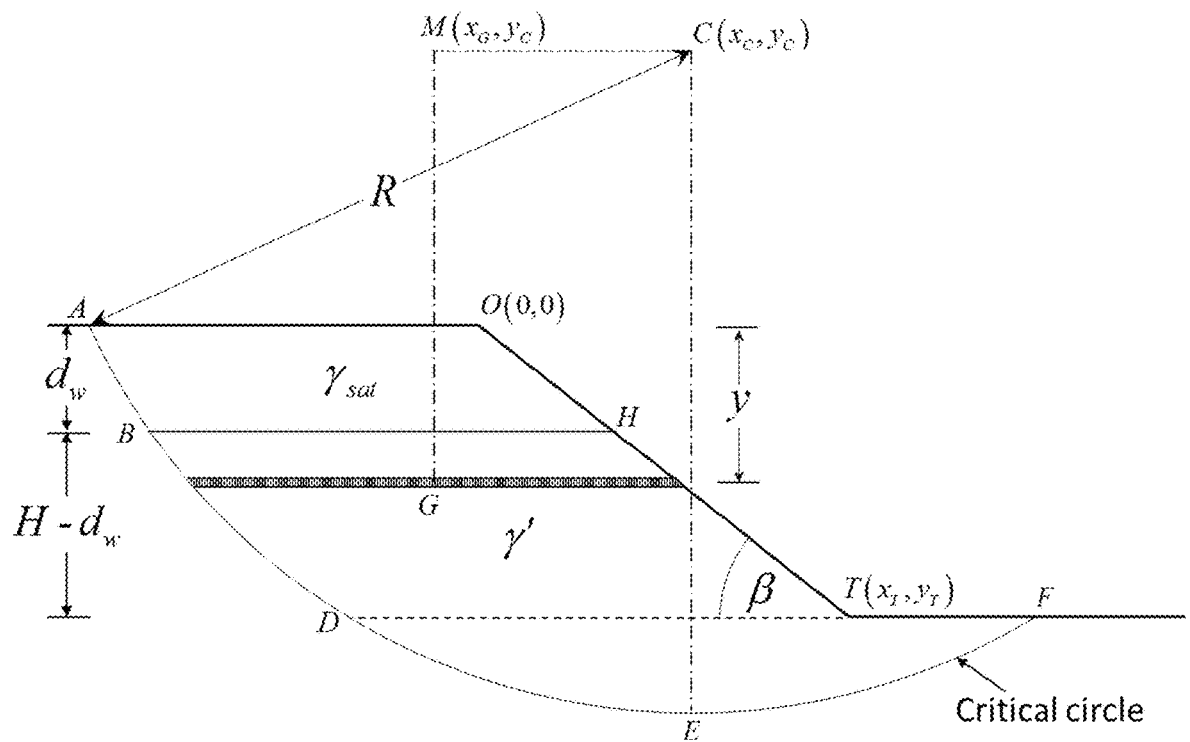
FIGS. 6A-6B are schematic views for computing an equivalent unit weight of a partially submerged undrained slope for a deep circle failure mechanism: a partially submerged undrained slope before homogenizing the unit weight in FIG. 6A and an equivalent slope without external water surface after homogenizing the unit weight in FIG. 6B.
Figure 7A:
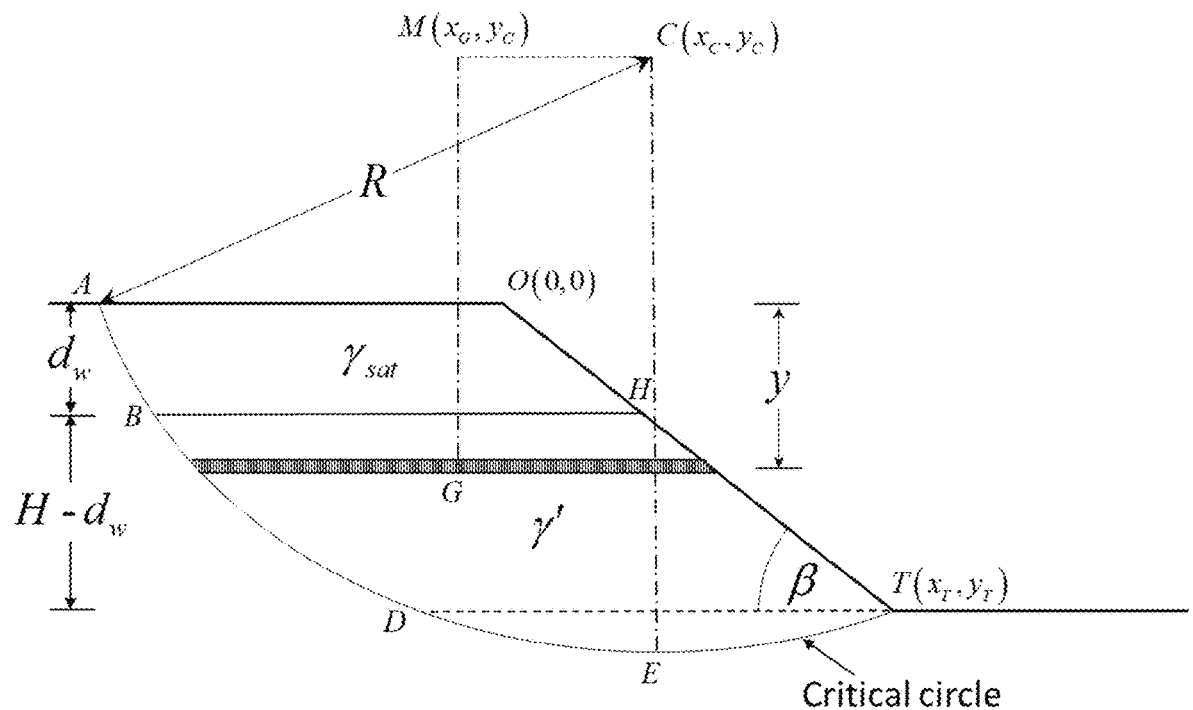
FIGS. 7A-7B are schematic views for computing an equivalent unit weight of a partially submerged undrained slope for a deep toe circle failure mechanism: a partially submerged undrained slope before homogenizing the unit weight in FIG. 7A and an equivalent slope without external water surface after homogenizing the unit weight in FIG. 7B.
Figure 8A:
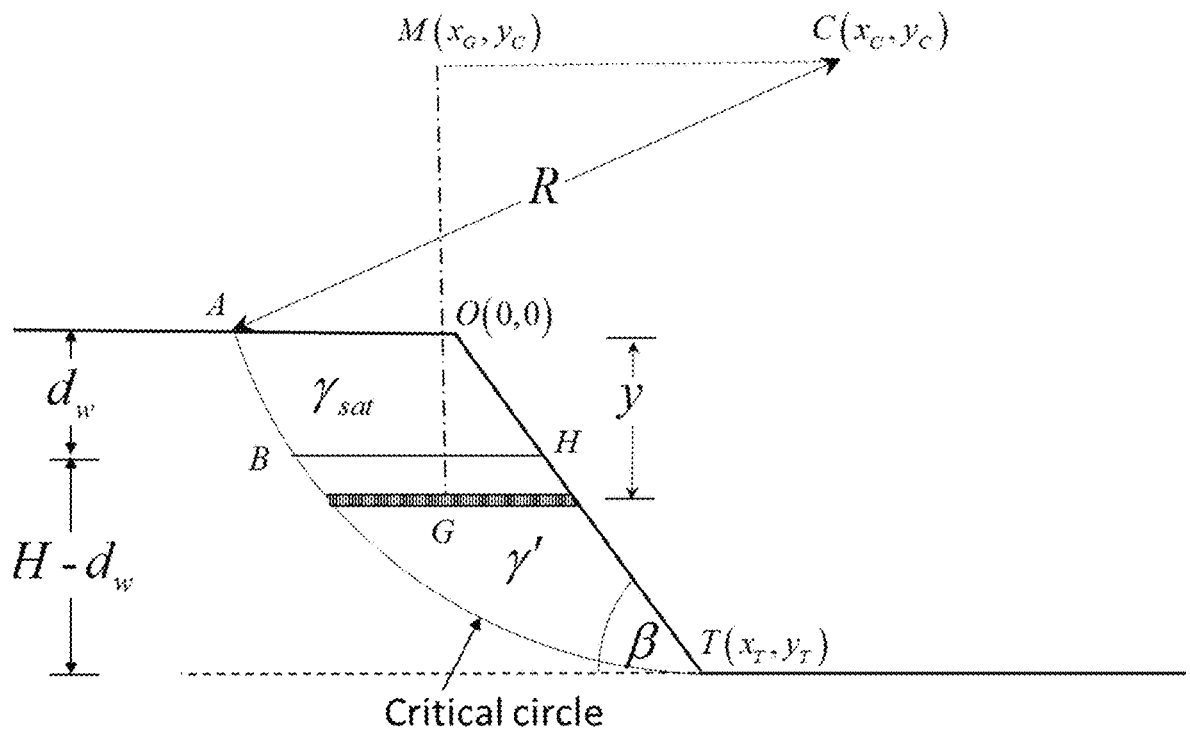
FIGS. 8A-8B are schematic views for computing an equivalent unit weight of a partially submerged undrained slope for a shallow toe circle failure mechanism: a partially submerged undrained slope before homogenizing the unit weight in FIG. 8A and an equivalent slope without external water surface after homogenizing the unit weight in FIG. 8B.

In some embodiments, the unit weight of ABHO is set as a saturated unit weight, and the unit weight of BDTH is set as a buoyant unit weight, and the unit weight of DEFT is set as a buoyant unit weight, as shown in FIG. 6A. In some embodiments, the unit weight of ABHO is set as a saturated unit weight, the unit weight of BDTH is set as a buoyant unit weight, and the unit weight of DET is set as a buoyant unit weight, as shown in FIG. 7A. In some embodiments, the unit weight of ABHO is set as a saturated unit weight, and the unit weight of BTH is set as a buoyant unit weight, as shown in FIG. 8A.

Figure 6B:
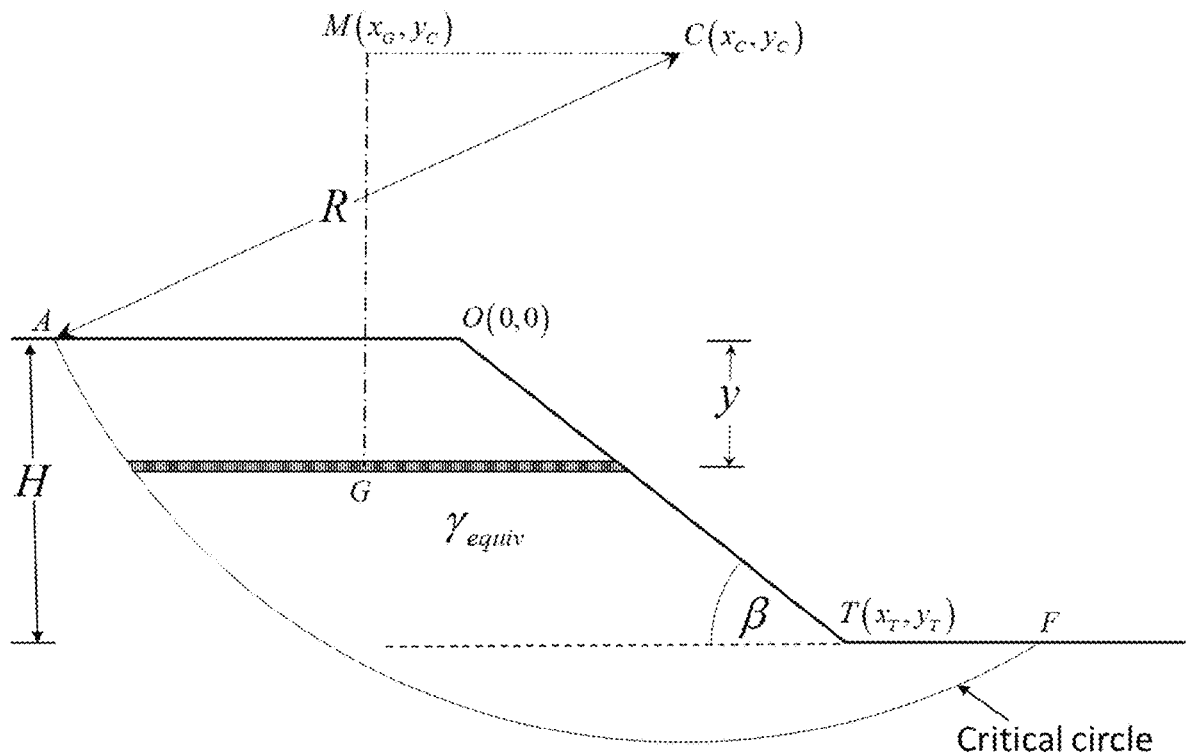
Figure 7B:
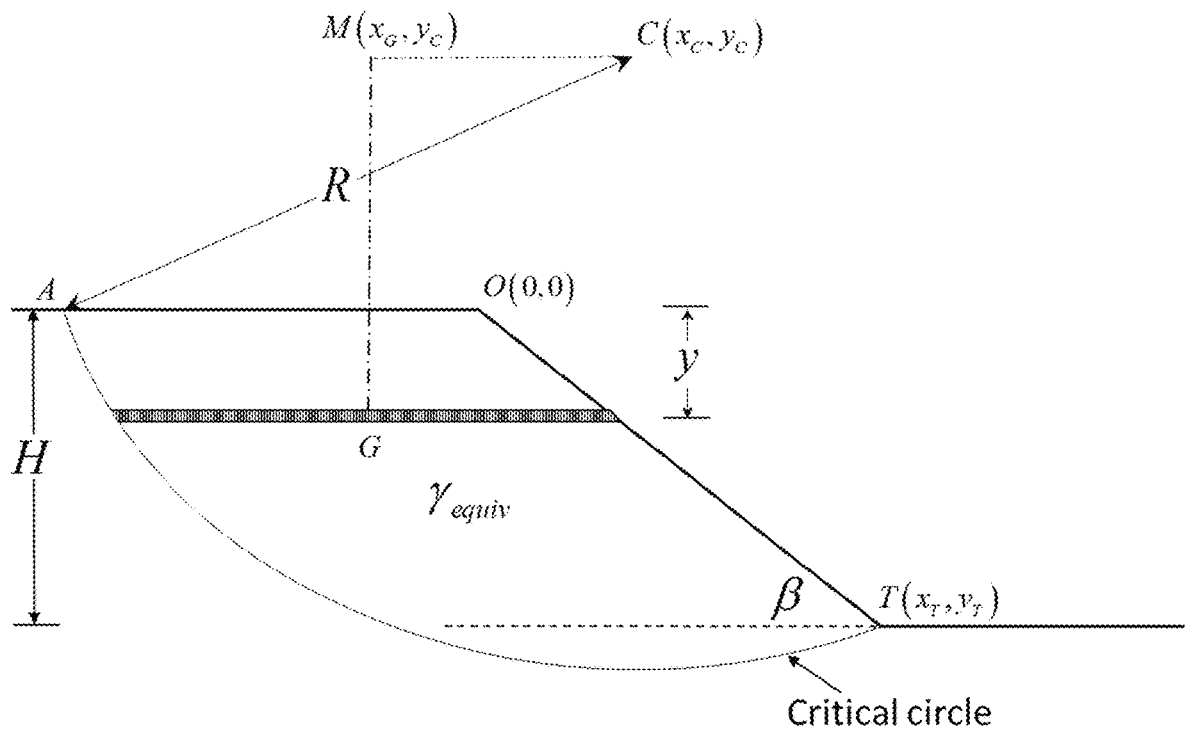

In some embodiments, according to the principle of moment equilibrium, the sum of the overturning moments of ABHO, BDTH, and DEFT or DET slip masses as shown in FIGS. 6A and 7A is equal to the overturning moment produced by the whole slip mass having an equivalent unit weight as shown in FIGS. 6B and 7B, which gives the equation (21) of overturning moment equilibrium:

$$M_1+M_2+M_3=M_0 \tag{21}$$

where $M_1$ denotes an overturning moment of the saturated unit weight slip mass ABHO above the external water level, $M_2$ denotes an overturning moment of the buoyant unit weight slip mass BDTH between the external water level and the toe of the slope, $M_3$ denotes the overturning moment of the buoyant unit weight slip mass DEFT or DET below the toe of the slope, and $M_0$ denotes the total moment of the whole slip mass having an equivalent unit weight. In some further embodiments, $M_3$ is 0.

Figure 8B:
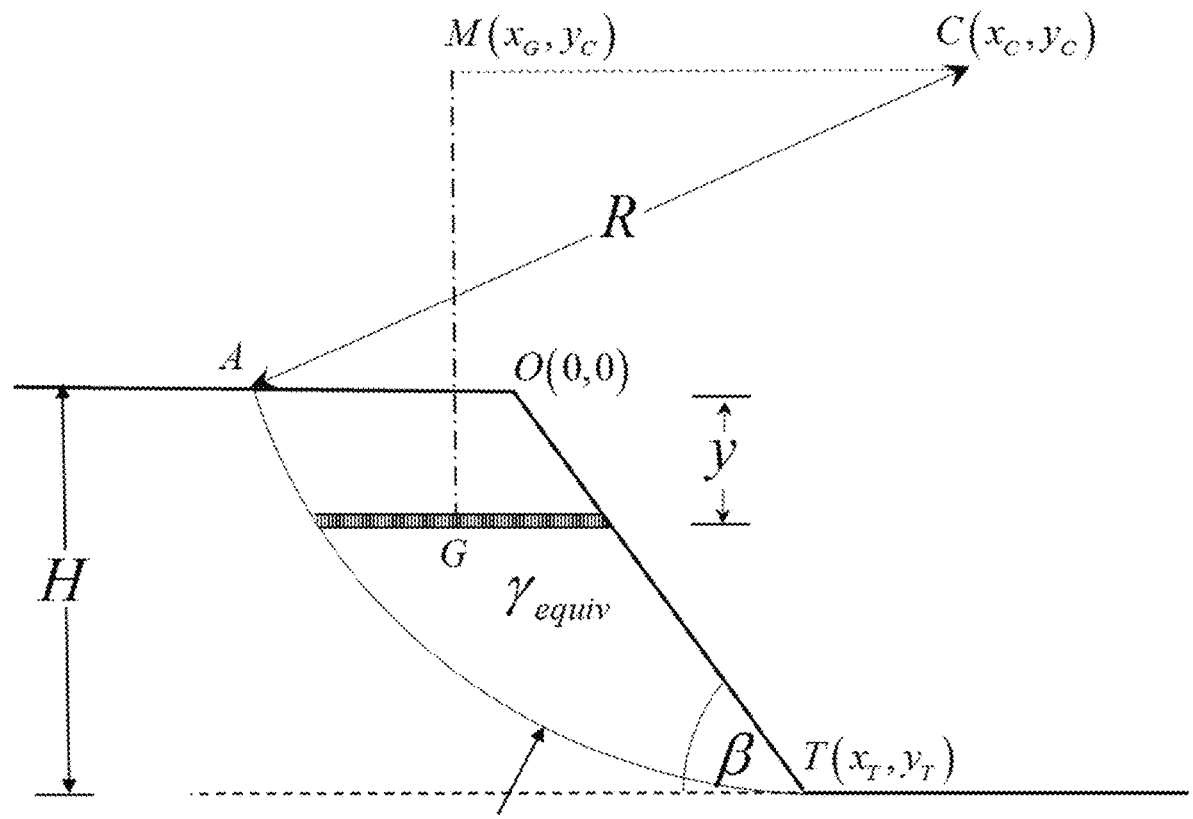

In some other embodiments, according to the principle of moment equilibrium, the sum of the overturning moments of ABHO and BTH slip masses as shown in FIG. 8A is equal to the overturning moment produced by the whole slip mass having an equivalent unit weight as shown in FIG. 8B, which gives the equation (8) of overturning moment equilibrium:

$$M_1+M_2=M_0 \tag{8}$$

In some embodiments, $$M_1 = \gamma_{sat} \int_{-d_w}^{0}(x_C - x_G)dA \tag{9}$$

where $\gamma_{sat}$ denotes a saturated unit weight of soil, $x_c$ denotes the horizontal coordinate value of the center of the circle corresponding to the interface arc formed by the critical slip surface, $x_G$ denotes the horizontal coordinate value of the centroid of a thin horizontal integral element of soil at a general depth y, $d_w$ denotes the depth of water outside slope measured below the crest, and dA denotes the integral element area.

In some embodiments, $$M_2 = \gamma' \int_{y_T}^{-d_w}(x_C - x_G)dA \tag{10}$$

where γ' denotes buoyant unit weight of soil, and $y_T$ denotes a vertical coordinate of a slope toe.

In some embodiments, $$M_0 = \gamma_{equiv} \int_{y_T}^{0}(x_C - x_G)dA \tag{11}$$

where $\gamma_{equiv}$ denotes the equivalent unit weight of soil.

Equation (11) is equal to equation (12) as deduced by Hunter & Schuster (1968)

$$M_O = \frac{\gamma H^3}{12}[1 - 2\cot^2\beta + 3\cot\lambda\cot\beta + 3\cot\alpha\cot\lambda - 3\cot\alpha\cot\beta]. \tag{12}$$

where H denotes the height of the slope, γ denotes the unit weight of a slope having a uniform unit weight.

Therefore, it gives $$M_O = M_1 + M_2 \tag{13}$$

$$= \gamma_{equiv}\int_{y_T}^{0}(x_C - x_G)dA$$

$$= \frac{\gamma H^3}{12}[1 - 2\cot^2\beta + 3\cot\lambda\cot\beta + 3\cot\alpha\cot\lambda - 3\cot\alpha\cot\beta]$$

which reflects the equivalent relationship between the overturning moment of partially submerged undrained slope as shown in FIG. 2 and that of a uniform slope without external water surface and having equivalent unit weight as shown in FIG. 4.

In some embodiments, in order to resolve the equations (9), (10) and (11), from a circular arc equation of a slip surface:

$$x = x_C - \sqrt{R^2 - (y - y_C)^2}, \text{ and} \tag{14}$$

a slope equation:

$$x = -\frac{y}{\tan\beta} \tag{15}$$

it gives $$x_G = \frac{1}{2}\left(x_C - \sqrt{R^2 - (y - y_C)^2} - \frac{y}{\tan\beta}\right) \quad (16)$$

which further gives $$x_C - x_G = \frac{1}{2}\left[\sqrt{R^2 - (y - y_C)^2} + \left(\frac{y}{\tan\beta} + x_C\right)\right] \quad (17)$$

$$dA = \left[\sqrt{R^2 - (y - y_C)^2} + \left(\frac{y}{\tan\beta} + x_C\right)\right]dy \quad (18)$$

where for a deep toe circle and a shallow toe circle, the critical slip surface can also be expressed as:

$$R = \frac{H}{2\sin\alpha\sin\lambda} \quad (7)$$

$$x_c = \frac{H}{\tan\beta} - R\sin(\alpha - \lambda) \quad (7\text{-}1)$$

$$y_c = R\cos(\alpha - \lambda) - H, \text{ and} \quad (7\text{-}2)$$

for a deep circle, the critical slip surface can also be expressed as:

$$R = \frac{H}{2\sin\alpha\sin\lambda} \quad (7)$$

$$x_c = \frac{H}{\tan\beta} - [R\sin(\alpha - \lambda) - nH] \quad (7\text{-}3)$$

$$y_c = R\cos(\alpha - \lambda) - H. \quad (7\text{-}4)$$

Substituting equations (17) and (18) into equations (9)-(11) and then into equation (13) provides an equivalent unit weight:

$$\gamma_{equiv} = \frac{\gamma_{sat}\int_{-d_W}^{0}(x_C - x_G)dA + \gamma'\int_{y_T}^{-d_W}(x_C - x_G)dA}{\int_{y_T}^{0}(x_C - x_G)dA}. \quad (19)$$

According to the analytical solution of equivalent unit weight obtained from the optimal critical slip surface, a verification is performed below by using an optimization program based on the analytical equation (1) and (3) regarding two aspects:

$$FS = N\frac{\rho}{\gamma}, \text{ and} \quad (1)$$

$$N = \frac{3}{\sin^2\alpha\sin^2\lambda}\frac{[\cot\lambda + \alpha(1 + 2M - \cot\alpha\cot\lambda)]}{(1 - 2\cot^2\beta + 3\cot\lambda\cot\beta + 3\cot\alpha\cot\lambda - 3\cot\alpha\cot\beta)}. \quad (3)$$

Figure 9:
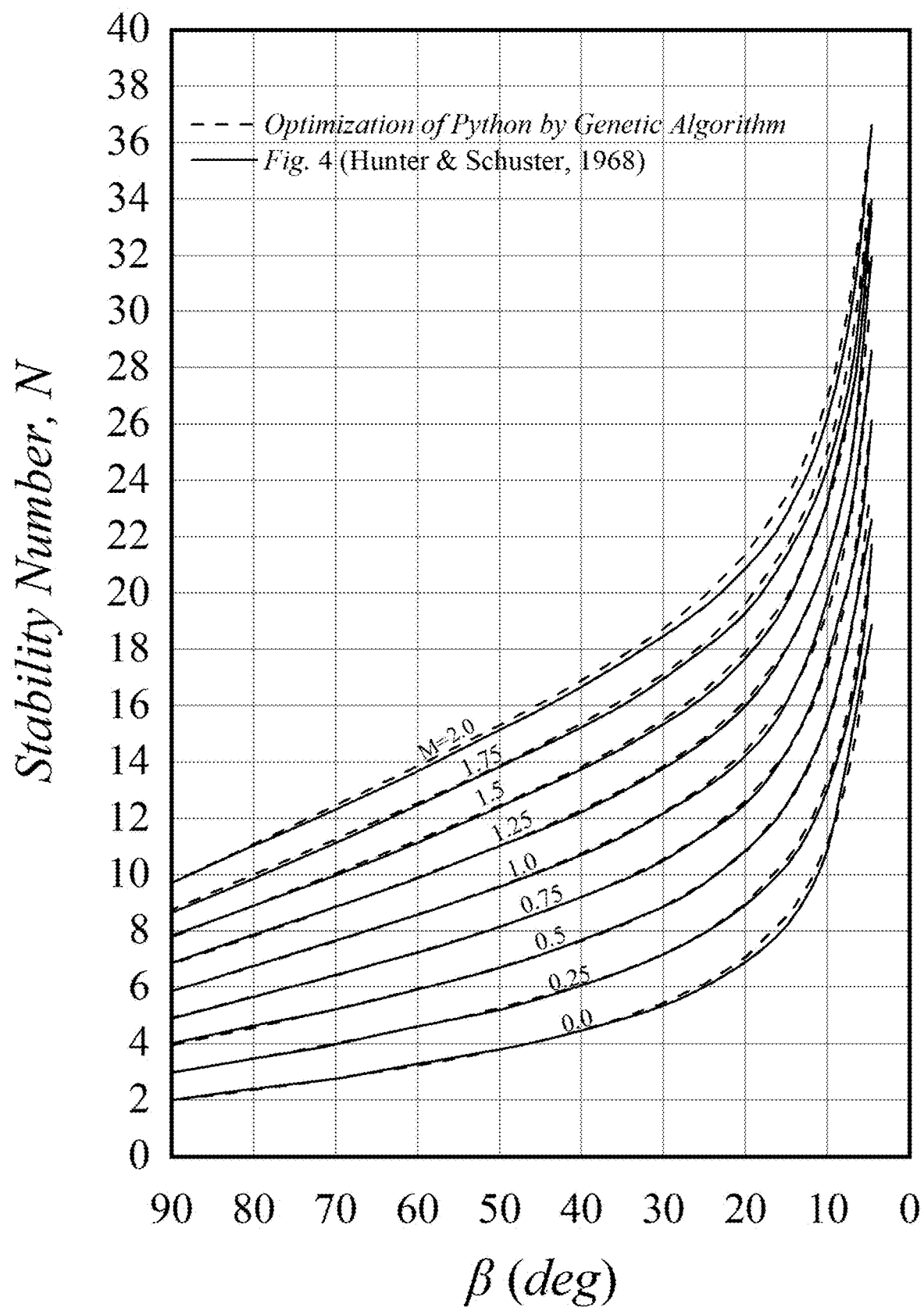
FIG. 9 is a stability chart of an undrained slope ($\phi=0$) where strength increases linearly with depth according to Hunter & Schuster (1968) (solid line) and after optimization in this application (dotted line).

(a) The stability chart of undrained slope ($\phi=0$) where strength increases linearly with depth was initially established by Hunter & Schuster (1968) regarding slopes having homogeneous unit weight, for example, a submerged case or a case without water outside the slope. Therefore, the two cases are verified below, and the results are shown in FIG. 9 for comparison. For a slope inclination of 5°-30°, the result obtained by Python optimization (dotted line in FIG. 9) is very similar to, in particular, slightly larger than, that (solid line in FIG. 9) in the stability chart of Hunter & Schuster (1968). For a slope inclination of 30°-90°, the result (dotted line in FIG. 9) obtained by Python optimization is well consistent with that (solid line in FIG. 9) in the stability chart of Hunter & Schuster (1968).

Figure 10:
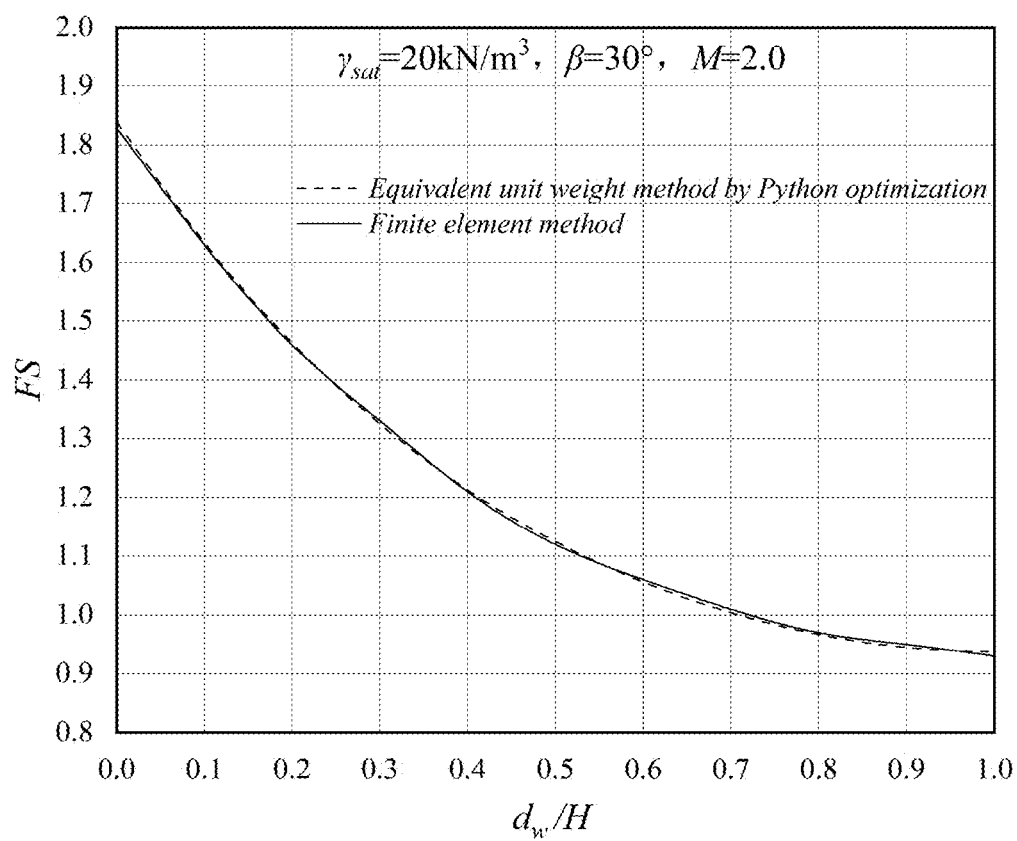
FIG. 10 is a diagram of a factor of safety FS vs external water level $d_w/H$ at $\gamma_{sat}=20$ kN/m$^3$, M=2, and $\beta=30°$.

(b) For a partially submerged undrained slope with external water level, taking the situation where $\gamma_{sat}$=20 kN/m³, M=2, and $\beta$=30° as an example, the factors of safety obtained from the above equivalent unit weight analysis by the Python optimization program are verified against that obtained by finite element strength reduction method, as shown in FIG. 10. It can be seen from the result that the factors of safety obtained by both methods are well consistent with each other, confirming that the analytical solution of equivalent unit weight by equivalent overturning moment are correct.

For studying the effect of dimensionless strength gradient parameter M on equivalent unit weight $\gamma_{equiv}$, the equivalent unit weight is further and comprehensively considered based on the following parameters, in order to reveal the relevant variables on which the equivalent unit weight depends on and make the value range of the dimensionless strength gradient parameter M and the slope inclination $\beta$ consistent with the stability chart.

$\gamma_{sat}$=15 kN/m³, 16 kN/m³, 17 kN/m³, 18 kN/m³, 19 kN/m³, 20 kN/m³;

$\beta$=5°, 10°, 20°, 30°, 40°, 50°, 60°, 70°, 80°, 90°;

M=0.0, 0.25, 0.5, 0.75, 1.0, 1.25, 1.5, 1.75, 2.0;

$d_w/H$=0.0, 0.1, 0.2, 0.3, 0.4, 0.5, 0.6, 0.7, 0.8, 0.9, 1.0.

Figure 11:
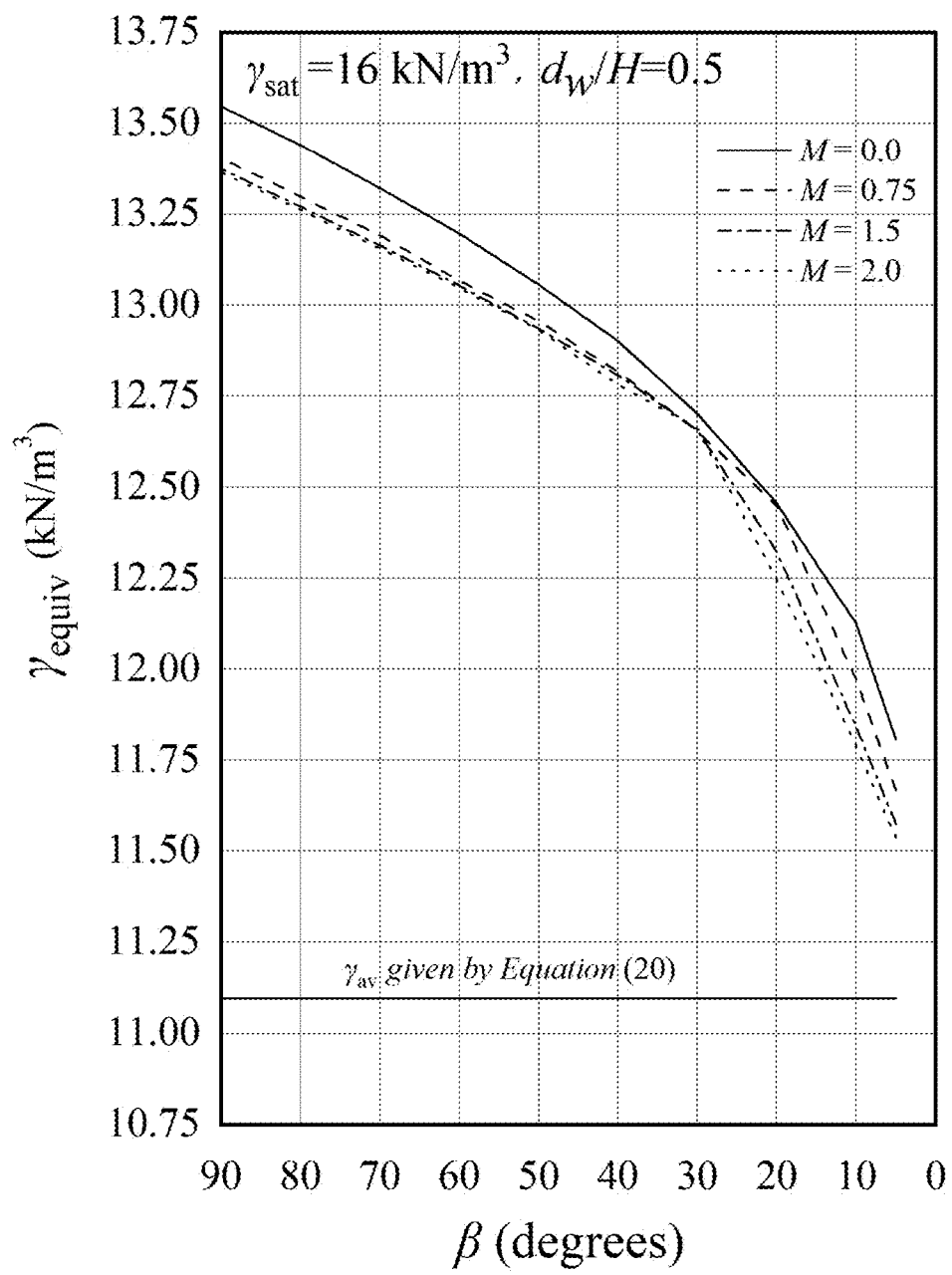
FIG. 11 is a diagram of an equivalent unit weight $\gamma_{equiv}$ for different $\beta$ and M at $\gamma_{sat}=16$ kN/m$^3$ and $d_w/H=0.5$.

A series of optimization calculations show the equivalent unit weight $\gamma_{equiv}$ is primarily affected by $\gamma_{sat}$, $\beta$ and $d_w/H$. Furthermore, typical results for the case of $\gamma_{sat}$=16 kN/m³, $d_w/H$=0.5 with M=0.0, 0.75, 1.5, 2.0, illustrate the influence of M on the equivalent unit weight, as shown in FIG. 11. It is noted that all $\gamma_{equiv}$ values lie in a narrow band between M=0 and M=2.0 with the differences across the entire range of $\beta$ not exceeding 0.34 kN/m³. It is also noted that the $\gamma_{av}$ value from simple averaging (equation 20 and FIG. 11) is always less than even the lowest boundary values of $\gamma_{equiv}$ by up to 2.27 kN/m³ for higher values $\beta$.

$$\gamma_{av} = \frac{d_w\gamma_{zat} + (H - d_w)\gamma'}{H} = \gamma_{sat} - \left(1 - \frac{d_w}{H}\right)\gamma_w \quad (20)$$

Figure 14:
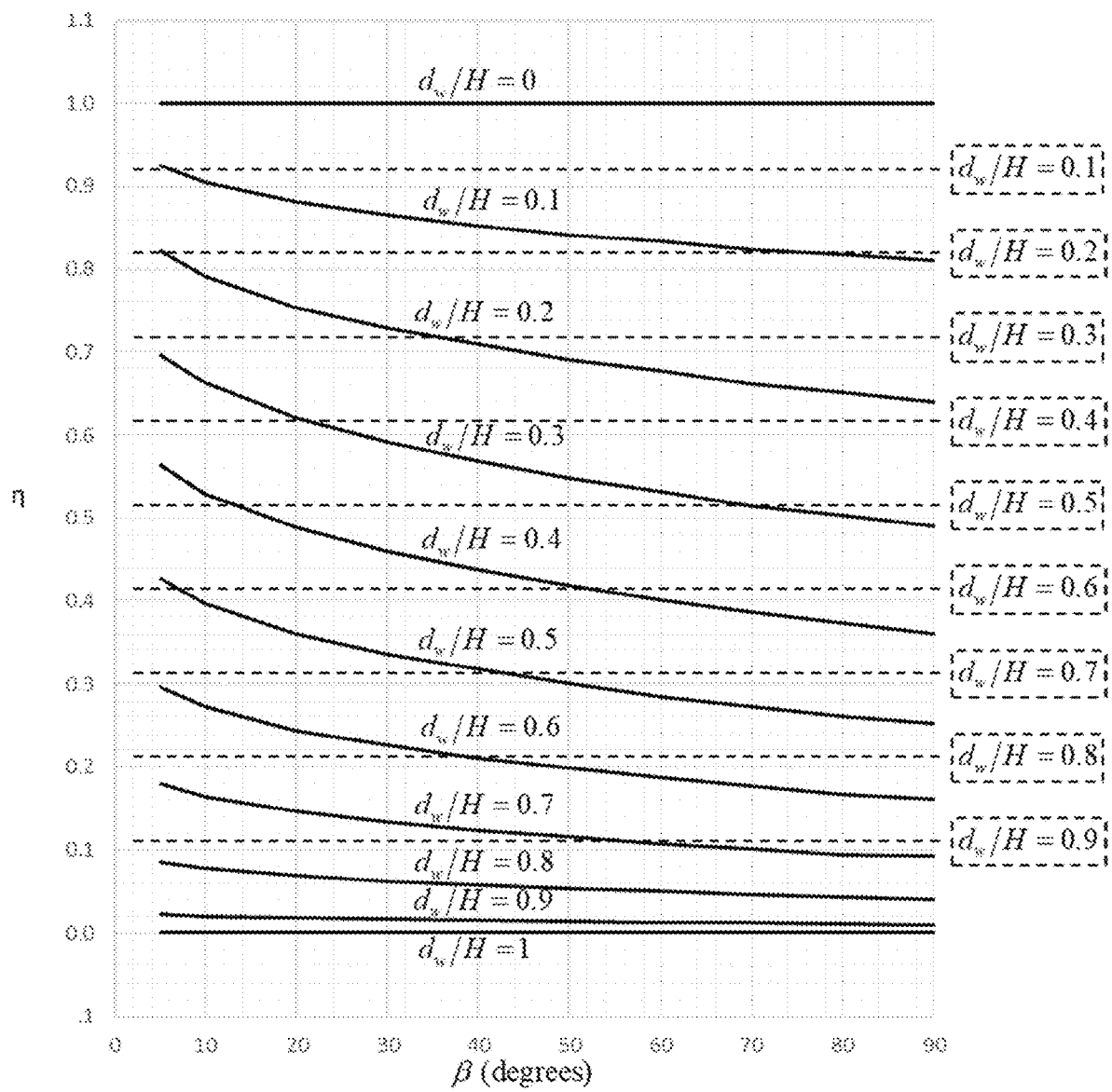
FIG. 14 is a chart for $\eta$ as a function of $\beta$ and $d_w/H$ where $\gamma_{equiv}=\gamma_{sat}-\eta\gamma_w$ (solid curved lines), horizontal dotted lines correspond to $\gamma_{av}$ where $\eta=1-d_w/H$.

Other results for the case of different $\gamma_{sat}$ and $d_w/H$ gave a similar trend as clearly indicated by the different values of $\eta$ for the $\gamma_{equiv}$ and $\gamma_{av}$ cases shown in FIG. 14. Thus, in order to obtain conservative values of the factor of safety and to neglect the relatively insignificant influence of M on the equivalent unit weight, it is reasonable to use the upper boundary values of $\gamma_{equiv}$ in equation (1).

Further, for studying the influence of average unit weight on factor of safety, use of $\gamma_{av}$ from equation (20) will be now compared with results obtained using the equivalent unit weight $\gamma_{equiv}$ as presented in FIG. 14 and equation (22).

Figure 12:
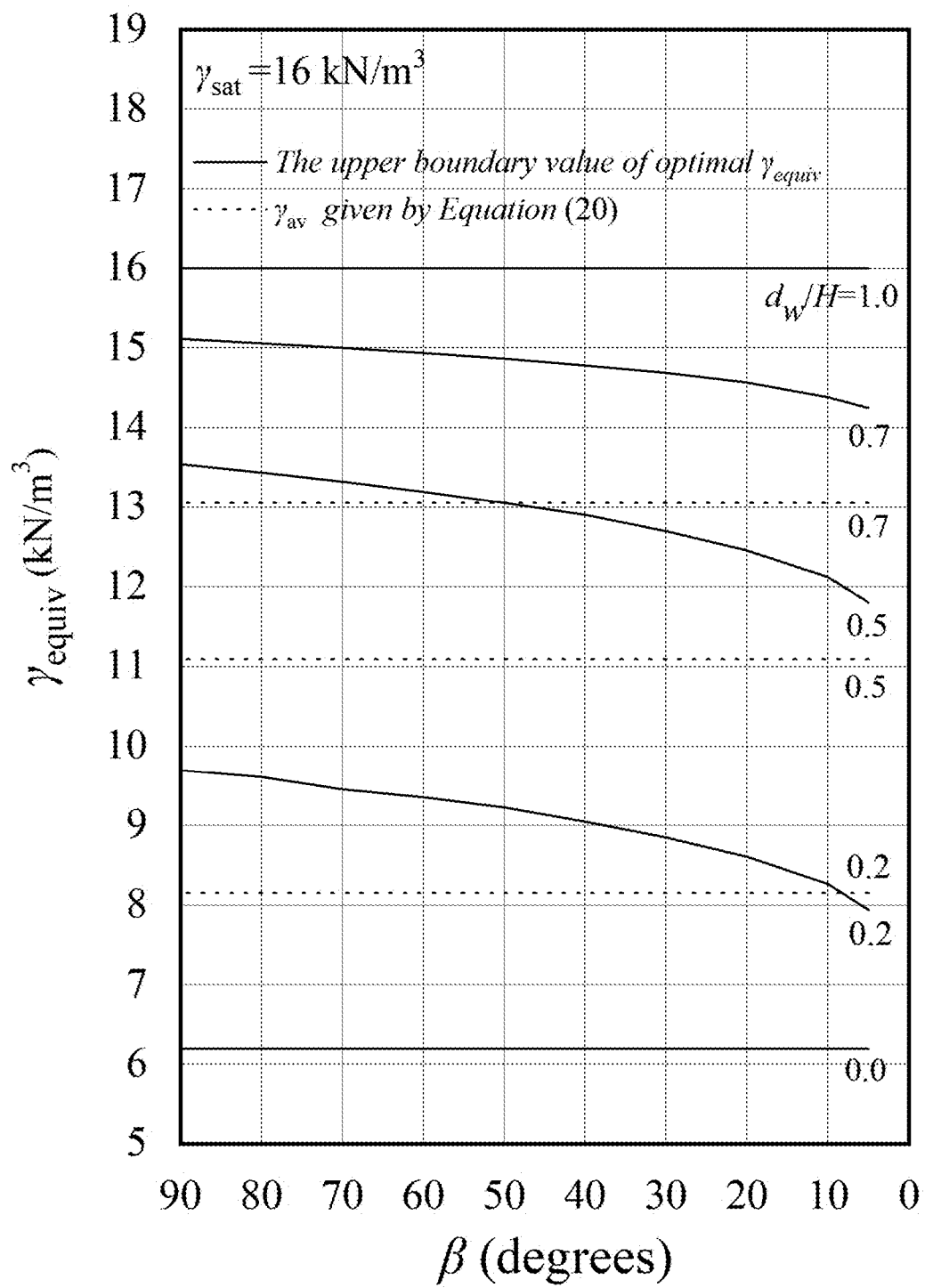
FIG. 12 is a diagram of $\gamma_{equiv}$ vs $\beta$ and $d_w/H$ at $\gamma_{sat}=16$ kN/m$^3$.
Figure 13:
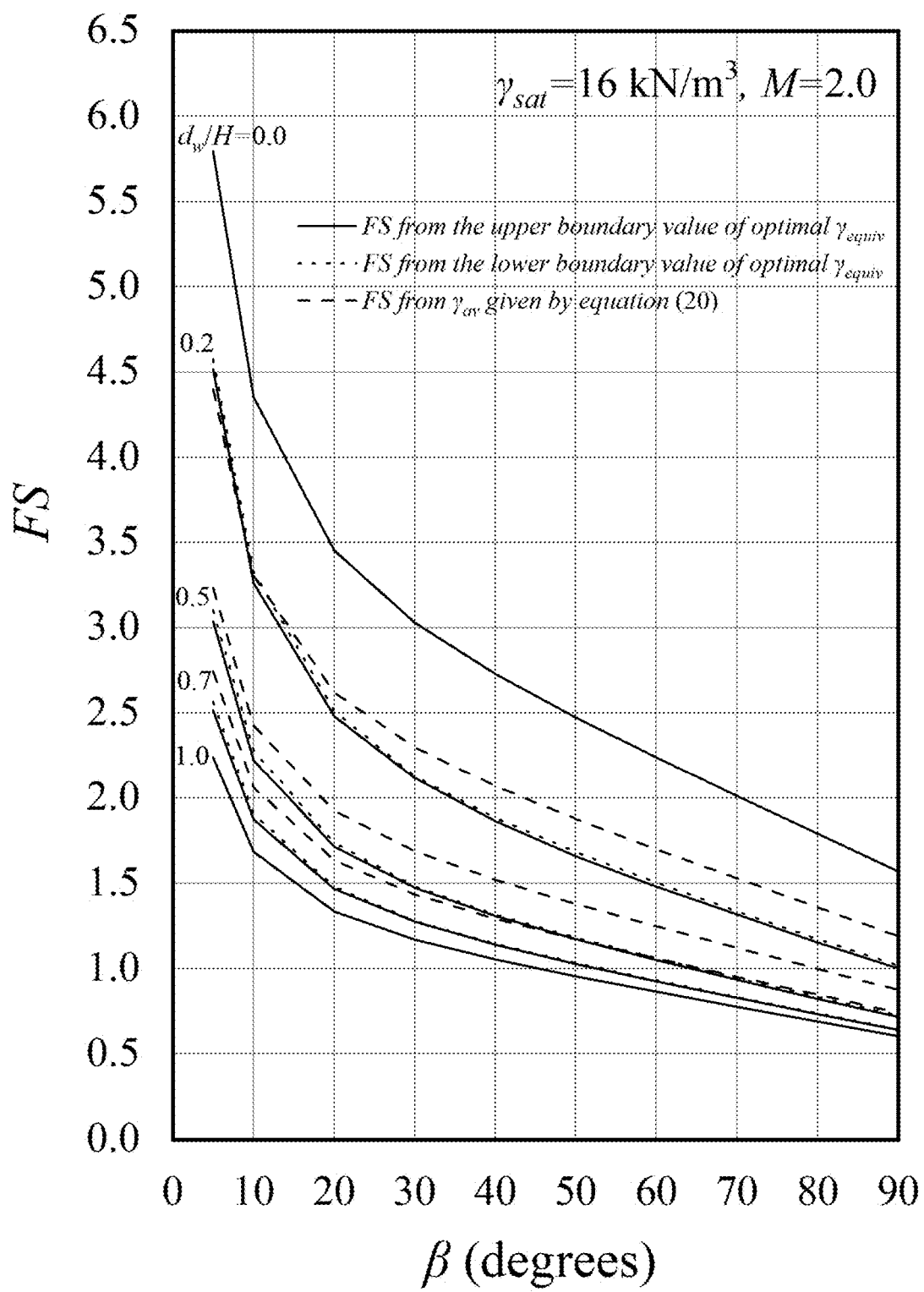
FIG. 13 is a diagram of FS vs $\beta$ and $d_w/H$ at $\gamma_{sat}=16$ kN/m$^3$ and M=2.

A typical set of results for the case of $\gamma_{sat}$=16 kN/m³ is shown in FIGS. 12 and 13. A saturated unit weight of $\gamma_{sat}$=16 kN/m³ is chosen because the smaller the saturated unit weight, the greater the impact of the average unit weight on the factor of safety.

It is obvious in FIG. 12 that the errors increase with increasing slope angle due to the upper boundary values of $\gamma_{equiv}$ moving further away from the constant $\gamma_{av}$ value given by equation (20). The differences between the two are about 0.04~1.55 kN/m³, 0.77~2.4 kN/m³, 1.19~2.06 kN/m³, respectively, for $d_w/H$=0.2, 0.5, 0.7. Values of $\gamma_{equiv}$ and $\gamma_{av}$ are the same for $d_w/H$=0.0, 1.0.

For comparison, FS from the upper and the lower boundary value of $\gamma_{equiv}$ and the value of $\gamma_{av}$ given by equation (20) against slope angle are plotted for $d_w/H$=0.0, 0.2, 0.5, 0.7, 1.0, as shown in FIG. 13. It is worth noting that the differences between FS from the upper and lower boundary values of $\gamma_{equiv}$ is very small compared with the differences between FS from the upper boundary value of $\gamma_{equiv}$ and the $\gamma_{av}$ which increase with increasing slope inclination. FS from the $\gamma_{av}$ value given by equation (20) are 19.0%, 22.1% and 15.8% greater than that from the upper boundary value of $\gamma_{equiv}$, respectively, for $d_w/H$=0.2, 0.5, 0.7. Similarly, with $\gamma_{sat}$=20 kN/m³, FS from the $\gamma_{av}$ value given by equation (20) are 12.7%, 16.0% and 12.1% greater than that from the upper boundary value of $\gamma_{equiv}$, respectively, for the same values of $d_w/H$. Validations of the factor of safety by finite element strength reduction reveal that the charts presented in this present application using $\gamma_{equiv}$ lead to lower and more conservative estimates of the factors of safety while those obtained using the simple weighted average approach lead to higher and unconservative estimates for almost all cases.

In summary, equation (20) ignores the influence of the slope angle and the changing overturning moment, leading to an underestimation of the unit weight and overestimation of the factor of safety.

For the purpose of obtaining a more accurate factor of safety FS, an equivalent unit weight chart which can be used at a wide variety of water levels $d_w/H$ for different saturated unit weight $\gamma_{sat}$ and slope inclinations $\beta$ in combination with the stability chart developed by Hunter & Schuster (1968) is proposed in the present application, in which the upper boundary values of the equivalent unit weight $\gamma_{equiv}$ under a variety of M conditions are acquired, ignoring the very little influence of Mon $\gamma_{equiv}$. Such an equivalent unit weight chart, are presented in FIG. 14 in the form of a dimensionless parameter $\Theta=f(\beta, d_w/H)$, where $$\gamma_{equiv}=\gamma_{sat}-\eta\gamma_w \quad (22)$$

The $\eta$ values needed in equation (22) are given by the solid black lines in FIG. 14, but for comparison, the present application has also included as horizontal dotted lines, the equivalent $\eta$ given by the simple averaging approach from equation (20). In the simple averaging approach, $\eta=(1-d_w/H)$ and does not depend on $\beta$. It should be noted that $\eta$ from the simple averaging approach for a given value of $d_w/H$ (dotted lines), is nearly always higher than that from the equivalent unit weight approach (solid lines) indicating that $\gamma_{equiv}>\gamma_{av}$. A higher unit weight results in a lower FS, hence the equivalent unit weight is more conservative than the simple averaged unit weight.

The following example is provided merely for the purpose of better understanding the present application for those skilled in the art, not intended to be considered as limiting the scope of protection of the present application in any way.

Computing Example

Figure 15:
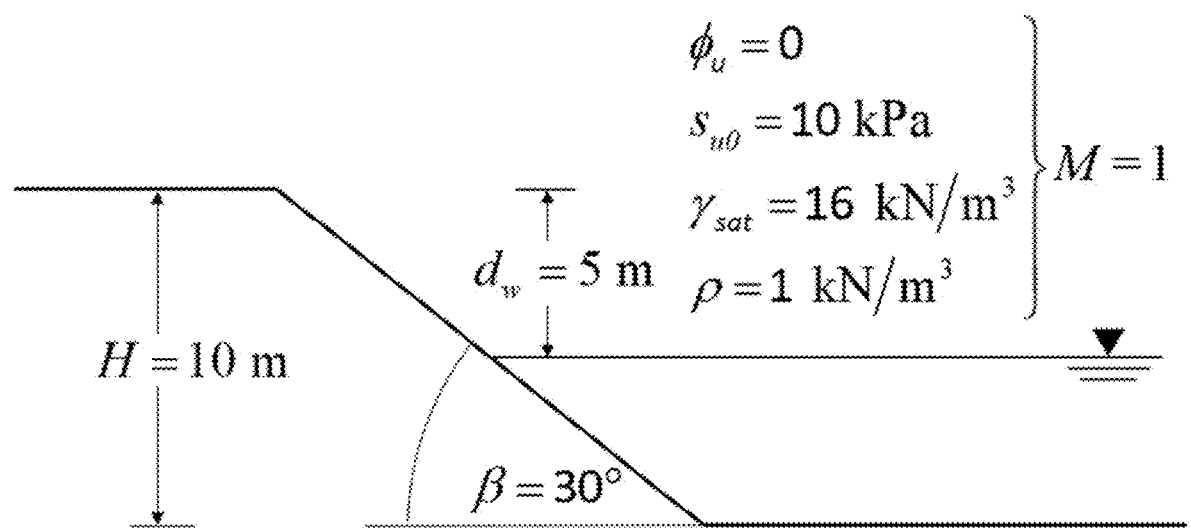
FIG. 15 is a schematic view of an example for computing the factor of safety of a partially submerged undrained slope ($\phi=0$) where strength increases linearly with depth.

Consider the partially submerged undrained slope with geometry, water depth and strength profile as shown in FIG. 15.

From FIG. 9, with M=1 and $\beta$=30°, N=12.2 and from FIG. 14 with $\beta$=30° and $$\frac{d_w}{H} = 0.5,$$

$\eta$=0.335 hence $\gamma=\gamma_{equiv}=\gamma_{sat}-\eta\gamma_w$=16−0.335×9.81=kN/m³

Finally, the factor of safety is given from equation (1) as:

$$FS = N\frac{P}{\gamma} = 12.2 \times \frac{1}{12.7} = 0.96$$

In comparison, from equation (20) or FIG. 14, $$\eta = 1 - \frac{d_w}{H} = 0.5$$

$$\gamma_{av} = \gamma_{sat} - \eta\gamma_w = 16 - 0.5 \times 9.81 = 11.1 \frac{kN}{m^3}$$

and $$FS = N\frac{P}{\gamma} = 12.2 \times \frac{1}{11.1} = 1.10$$

The relative error from the average unit weight approach is therefore given by:

$$\text{Error} = \frac{1.10 = 0.96}{0.96} \times 100\% = 15\%$$

As a check, the factor of safety from finite element strength reduction was given as 0.97.

It can be seen that, the factor of safety calculated from the equivalent unit weight according to the present application was 0.96, indicating that the slope was in an unstable state. In contrast, the factor of safety obtained from the average unit weight given by equation (20) was 1.10 which is larger than 1, indicating that the slope is in a stable state. Therefore, the factor of safety obtained from the average unit weight given by equation (20) had an error of 15% in comparison that obtained according to the present application, which was an overestimated factor of safety, leading to unsafe estimation.

What is claimed is:

1. A method for constructing a slope of a ground surface, adapted to determine a factor of safety FS of the slope of the ground surface for determining whether the slope of the ground surface is in a stable state and construct the slope of the ground surface in a slope engineering, and comprising the following steps:

Step 1: acquiring parameters of the slope of the ground surface including unit weights of soil, slope geometry, soil strength and external water level;

Step 2: formulating a formula of stability number N into a target function and determining constrained conditions of variable geometric parameters in the target function;

Step 3: retrieving a combination of the variable geometric parameters by calling a genetic algorithm library through a Python program to obtain a minimum stability number $N_{min}$;

Step 4: determining a critical slip surface defined by a position according to the retrieved combination of the variable geometric parameters and the slope geometry acquired in Step 1;

Step 5: transforming the determined critical slip surface into a critical slip surface defined by a circular arc radius R of the critical slip surface and horizontal and vertical coordinate values $x_c$ and $y_c$ of a circle center of the critical slip surface, and determining overturning moments of slid masses above and below external water level of the critical slip surface;

Step 6: determining an equivalent unit weight $\gamma_{equiv}$ according to overturning moment equilibrium; and Step 7: determining the factor of safety FS from the obtained minimum stability number $N_{min}$, a gradient $\rho$ of soil strength and the equivalent unit weight $\gamma_{equiv}$ obtained in Step 6 according to the following formula (1):

$$FS = N_{min}\frac{\rho}{\gamma}, \tag{1}$$

where $\gamma$ is equal to the equivalent unit weight $\gamma_{equiv}$, and when the obtained FS is larger than 1.0, the slope of the ground surface is constructed.

2. The method according to claim 1, wherein, in Step 1, the unit weights of soil comprise a saturated unit weight of soil, a unit weight of water, an assigned saturated unit weight of soil above external water, and an assigned buoyant unit weigh of soil below external water, the slope geometry comprises a slope angle and a height of the slope of the ground surface, the soil strength comprises an undrained strength of the slope of the ground surface given by the equation:

$$s_u(z)=s_{u0}+\rho z \tag{2}$$

where $s_{u0}$ is the soil strength at crest level (z=0) and $\rho$ is the gradient of soil strength, and the external water level is defined as $d_w/H$ here $d_w$ denotes a depth of water level outside the slope from top of the slope of the ground surface, and H denotes the height of the slope of the ground surface.

3. The method according to claim 2, wherein, in Step 2, the target function for a circular arc failure mechanism is expressed as:

$$N = \frac{3}{\sin^2 \alpha \, \sin^2 \lambda} \frac{[\cot \lambda + \alpha(1 + 2M - \cot \alpha \cot \lambda)]}{(1 - 2 \cot^2 \beta + 3 \cot \lambda \cot \beta + 3 \cot \alpha \cot \lambda - 3 \cot \alpha \cot \beta)}, \tag{3}$$

where $\alpha$ denotes half of a central angle of a circular arc slip surface, $\lambda$ denotes an angle between a chord line of the circular arc slip surface and a horizontal plane, $\beta$ denotes an angle of the slope of the ground surface, and M denotes a dimensionless strength gradient parameter defined as:

$$M = \frac{h}{H}\frac{\gamma_w}{\gamma'} \tag{4}$$

where h denotes a specific water level in the slope of the ground surface, $\gamma_w$ denotes the unit weight of water, and $\gamma'$ denotes a buoyant unit weight.

4. The method according to claim 3, wherein, in Step 2, M is further defined as:

$$M = \frac{H_0}{H} = \frac{s_{u0}}{\rho H} \tag{5}$$

where $H_0$ denotes an intercept of a strength line.

5. The method according to claim 4, wherein, in Step 2, the variable geometric parameters comprise $\alpha$ and $\lambda$, and the constrained conditions comprise: $\alpha$: [0, 90°] and $\lambda$: [0, $\beta$].

6. The method according to claim 5, wherein, in Step 4, the position of the critical slip surface is defined by $$n = \frac{1}{2}(\cot \lambda - \cot \alpha - \cot \beta) \tag{6}$$

where a dimensionless value n denotes a measure of a distance the critical slip surface outcrops beyond a toe of the slope of the ground surface; and, when n is zero or negative, a critical circle passes through the toe, and when n is positive, the critical circle exists below the toe.

7. The method according to claim 6, wherein, in Step 5, for a deep toe circle or a shallow toe circle, transforming the determined critical slip surface into the critical slip surface defined by R, $x_c$ and $y_c$ is performed by $$R = \frac{H}{2 \sin \alpha \, \sin \lambda} \tag{7}$$

$$x_c = \frac{H}{\tan \beta} - R \, \sin(\alpha - \lambda) \text{ and} \tag{7-1}$$

$$y_c = R \, \cos(\alpha - \lambda) - H. \tag{7-2}$$

8. The method according to claim 7, wherein, in Step 5, for a deep circle, transforming the determined critical slip surface into the critical slip surface defined by R, $x_c$ and $y_c$ is performed by $$R = \frac{H}{2 \sin \alpha \, \sin \lambda} \tag{7}$$

$$x_c = \frac{H}{\tan \beta} - [R \, \sin(\alpha - \lambda) - nH] \text{ and} \tag{7-3}$$

$$y_c = R \, \cos(\alpha - \lambda) - H. \tag{7-4}$$

9. The method according to claim 8, wherein, in Step 6, the overturning moment equilibrium is expressed as:

$$M_1+M_2=M_0 \tag{8}$$

where $M_0$ denotes a total moment of a whole slip mass having an equivalent unit weight, $M_1$ denotes an overturning moment of saturated unit weight of slip mass above the external water level, and $M_2$ denotes an overturning moment of the buoyant unit weight of slip mass between the external water level and the toe of the slope of the ground surface.

10. The method according to claim 9, wherein, in Step 6, $M_1$ is defined as:

$$M_1 = \gamma_{sat} \int_{-d_w}^{0} (x_C - x_G) dA \tag{9}$$

where $\gamma_{sat}$ denotes saturated unit eight of soil, $x_G$ denotes a horizontal coordinate value of a centroid of a thin horizontal integral element of soil at a general depth y, $d_w$ denotes a depth of water outside the slope of the ground surface measured below a crest, and dA denotes an integral element area.

11. The method according to claim 10, wherein, in Step 6, $M_2$ is defined as:

$$M_2 = \gamma' \int_{y_T}^{-d_w} (x_C - x_G) dA \tag{10}$$

where $\gamma'$ denotes the buoyant unit weight, and $y_T$ denotes a vertical coordinate of the toe of the slope of the ground surface.

12. The method according to claim 11, wherein, in Step 6, $$M_0 = \gamma_{equiv} \int_{y_T}^{0} (x_C - x_G) dA \tag{11}$$

13. The method according to claim 12, wherein, in Step 6, the overturning moment equilibrium is further expressed as:

$$\begin{aligned} M_o &= M_1 + M_2 \\ &= \gamma_{equiv} \int_{y_T}^{0} (x_C - x_G) dA \\ &= \frac{\gamma H^3}{12} \left[ 1 - 2\cot^2\beta + 3\cot\lambda\cot\beta + 3\cot\alpha\cot\lambda - 3\cot\alpha\cot\beta \right]. \end{aligned} \tag{13}$$

14. The method according to claim 13, wherein, in Step 7, the equivalent unit weight $\gamma_{equiv}$ is obtained from an equation (22) in which $\eta$ is a dimensionless value obtainable from an equivalent unit weight diagram:

$$\gamma_{equiv} = \gamma_{sat} - \eta \gamma_w \tag{22}$$

* * * * *